United States Patent [19]

Anger et al.

[11] 4,140,913
[45] Feb. 20, 1979

[54] CHARGED-PARTICLE BEAM OPTICAL APPARATUS FOR THE REDUCTION IMAGING OF A MASK ON A SPECIMEN

[75] Inventors: Klaus Anger; Burkhard Lischke; Karl-Heinz Müller; Andreas Oelmann, all of Berlin, Fed. Rep. of Germany

[73] Assignee: Siemens Aktiengesellschaft, Munich, Fed. Rep. of Germany

[21] Appl. No.: 870,585

[22] Filed: Jan. 18, 1978

[30] Foreign Application Priority Data

Jan. 20, 1977 [DE] Fed. Rep. of Germany ....... 2702445

[51] Int. Cl.² ............................................ H01J 37/00
[52] U.S. Cl. ................................ 250/492 A; 250/398
[58] Field of Search .................... 250/492 A, 398, 396, 250/397; 313/361

[56] References Cited

U.S. PATENT DOCUMENTS

| | | | |
|---|---|---|---|
| 3,491,236 | 1/1970 | Newberry ......................... | 250/492 A |
| 3,745,385 | 7/1973 | Firtz et al. ........................ | 250/492 A |
| 3,876,883 | 4/1975 | Broers et al. ..................... | 250/492 A |

OTHER PUBLICATIONS

"Electron-Projection Microfabrication System," Heritage J. Vac. Sci. Tech., vol. 12, No. 6, Nov. 1975, pp. 1135–1140.

Primary Examiner—Bruce C. Anderson
Attorney, Agent, or Firm—Kenyon & Kenyon, Reilly, Carr & Chapin

[57] ABSTRACT

A charged-particle beam optical apparatus for the reduction imaging of a mask on a specimen to be examined. The apparatus comprises a beam source for illuminating the mask, a condenser lens system comprising a plurality of lenses generating a ray bundle which strikes the mask as a probe, a beam deflection system located ahead of the last of the condenser lenses in the direction of the beam path, and a projection lens system including a long focal length intermediate lens and a short focal length imaging lens. The intermediate and imaging lenses are spaced apart by a distance which is equal to the sum of their focal lengths, and the mask is located in the front focal plane of the intermediate lens. The improvement of the invention comprises the provision of means for generating a probe in the form of a ray bundle comprising a plurality of rays which are at least approximately parallel to each other and which simultaneously illuminate a partial two-dimensional surface area of the mask.

13 Claims, 4 Drawing Figures

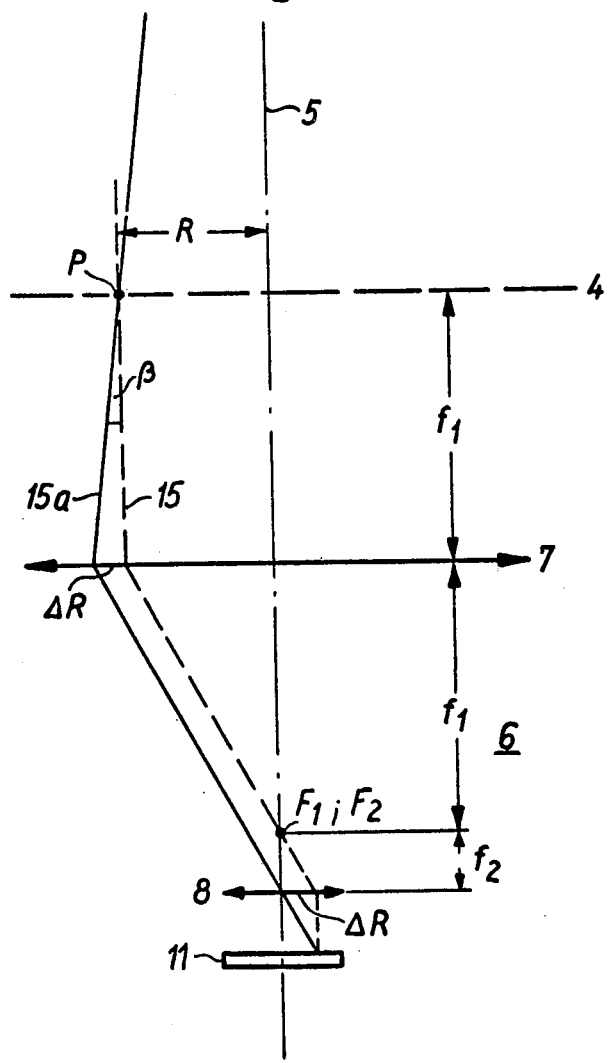

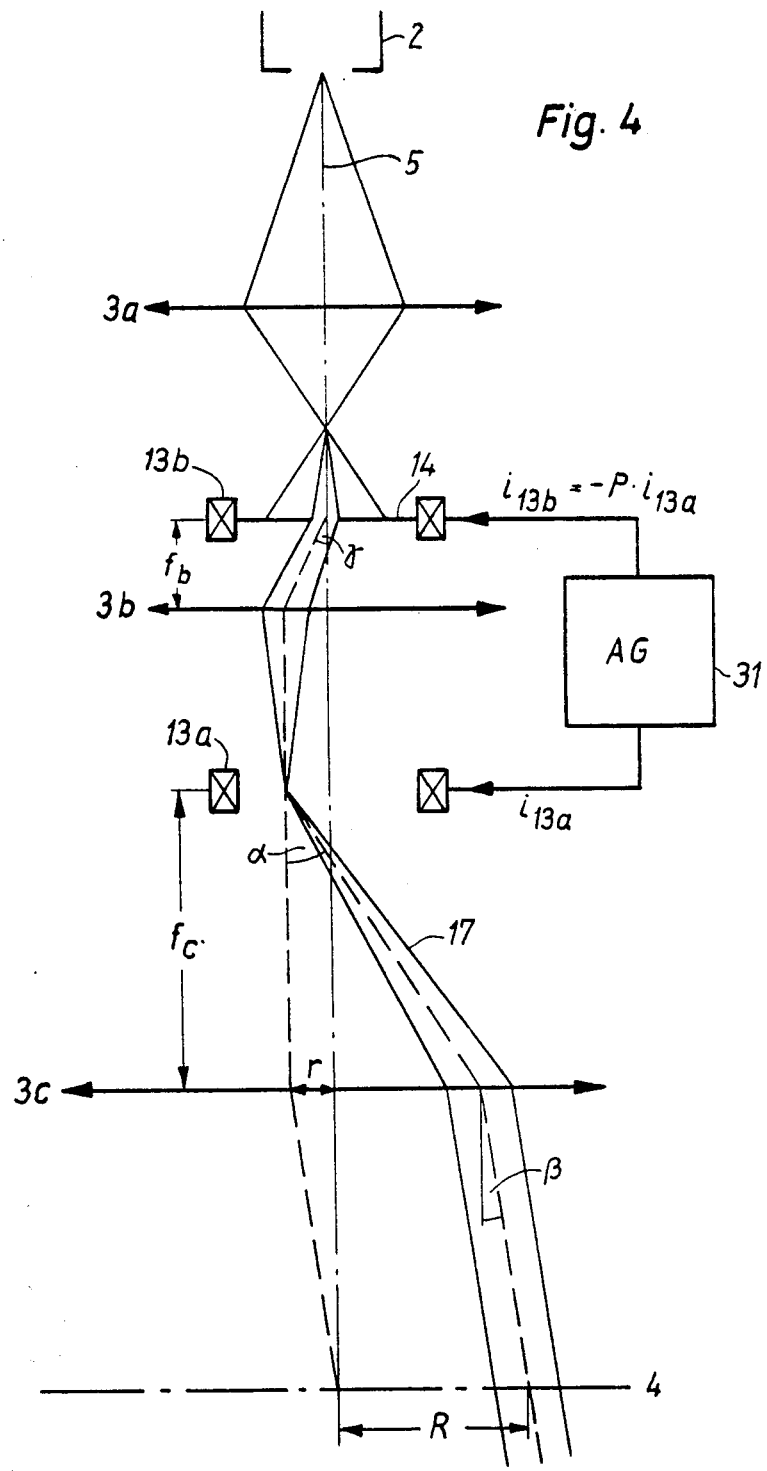

CHARGED-PARTICLE BEAM OPTICAL APPARATUS FOR THE REDUCTION IMAGING OF A MASK ON A SPECIMEN

BACKGROUND OF THE INVENTION

1. Field of the Invention

This invention relates to a charged-particle beam optical apparatus for the reduction imaging of a mask on a specimen to be examined which comprises a beam source for illuminating the mask, a condenser lens system comprising a plurality of condenser lenses for generating a ray bundle which strikes the mask as a probe, a beam deflection system located ahead of the last of the condenser lenses in the direction of the beam path, and a projection lens system including a long focal length intermediate lens and a short focal length imaging lens which are spaced apart by a distance which is equal to the sum of their focal lengths, the mask being located in the front focal plane of the intermediate lens.

2. Description of the Prior Art

An apparatus of the foregoing type is described in the paper by Heritage, J. Vac. Sci. Technol., Vol. 12 (1975), pages 1135 et seq. It is used particularly for generating patterns on semiconductor wafers in the fabrication of integrated circuits. The imaging scale in such an apparatus is about 10:1 and the image of the mask is projected on the specimen so that (a) the entire mask area to be imaged is simultaneously illuminated and (b) so that all points on the mask are simultaneously imaged by the projection lens system of the apparatus. In order to adjust the mask and the specimen relative to each other, the excitation of the condenser lens system must be increased so that the beam source (assuming the apparatus lenses are ideal) is imaged by the projection lens system as a point in the mask plane and as a point in the specimen plane. A deflection system is located above the mask and is excited so that the point-shaped probe formed by the beam scans a test opening in the mask plane. This scanning generates an image of the test opening in the specimen plane, and a detector located near the specimen registers secondary electrons released at the specimen (which may be a semiconductor wafer). The signal generated by the detector is transmitted to a monitor on the picture screen of which an image showing an adjustment marking on the specimen and an image of the test opening are displayed. To effect adjustment, the mask or the specimen is shifted until the images of the test opening and the adjustment marking coincide. After adjustment, the excitation of the condenser lens system must be reset so that the mask is integrally illuminated for imaging its entire area on the specimen. Exact resetting of the excitation of the condenser lenses is, however, very difficult if the condenser lens adjusted includes an iron shell, which is usually the case.

Since the condenser lens system of the apparatus does not consist of ideal lenses, but instead causes errors, the image of the beam source in the mask plane is not a point. As a result, the test opening in the mask is imaged in the specimen plane with an unavoidable lack of definition. The accuracy of the adjustment is accordingly limited.

SUMMARY OF THE INVENTION

It is therefore an object of the present invention to provide an improved charged-particle beam optical apparatus for the reduction imaging of a mask on a specimen which overcomes the aforementioned disadvantages of heretofore known apparatus, eliminates the sources of error caused by the changing of the condenser lens excitation in such an apparatus, and improves the imaging of the test opening in the mask on the specimen in the apparatus.

These and other objects of the invention are achieved in a charged-particle beam optical apparatus for the reduction imaging of a mask on a specimen to be examined. The apparatus comprises a beam source for illuminating the mask, a condenser lens system comprising a plurality of condenser lenses for generating a ray bundle which strikes the mask as a probe, a beam deflection system located ahead of the last of the condenser lenses in the direction of the beam path, and a projection lens system including a long focal length intermediate lens and a short focal length imaging lens. The intermediate and imaging lenses are spaced apart by a distance which is equal to the sum of their focal lengths and the mask is located in the front focal plane of the intermediate lens. The improvement comprises means for generating a probe in the form of a ray bundle comprising a plurality of rays which are at least approximately parallel to each other and which simultaneously illuminate a partial two-dimensional surface area of the mask. The partial surface area of the mask is a region of the mask, the area of which is small compared to the entire surface area of the mask to be imaged, but which still contains details which are to be imaged separately. The area ratio can range from approximately $1:10^2$ to approximately $1:10^6$. For a mask having a diameter of 10 cm, this means that the diameter of the probe will range from 100 $\mu$m to 1 cm.

The arrangement of the invention enables the same condenser lens adjustment to be used during relative adjustment of the mask and the specimen as during the imaging of the entire mask. Imaging of the mask can be achieved, for example, by scanning the mask line by line in the customary manner by appropriately exciting the deflection system of the apparatus. The image of the test opening as well as that of the other regions of the mask is sharp and contains high beam intensity.

The apparatus of the invention has other advantages, however, aside from the foregoing. In the apparatus described in the paper by Heritage, the mask is illuminated basically by a ray which travels in a direction parallel to the optical axis of the apparatus. Due to the aperture error of the last condenser lens, however, it is not possible to precisely achieve this parallel travel. Heritage, therefore, teaches the defocusing of the last condenser lens with the mask integrally illuminated to compensate for the aperture error for the outer region of the mask and decrease the image distortion. In contrast thereto, the apparatus of the invention permits the aperture error of the last condenser lens to be dynamically compensated for so that the ray bundle strikes the mask, depending upon the excitation of the deflection system, at a predetermined angle, for example, parallel to the optical axis of the apparatus. The distortion error, among other things, can thereby be completely eliminated. The apparatus of the invention also allows the image field curvature to be dynamically compensated for through excitation of the imaging lens as a function of the excitation of the deflection system. Similarly, a stigmator associated with the imaging lens can be dynamically excited so that astigmatism, depending upon the deflection, is optimally corrected.

In a preferred embodiment of the invention, the generating means comprises means for generating a probe so that the mask is illuminated divergently and a ray of the ray bundle strikes the mask at a distance R from the optical axis of the apparatus at an angle β with respect to the optical axis. The angle β is measured in radians and is defined by the equation $$\beta = R \cdot f_2/f_1^2,$$

where $f_1$ represents the focal length of the intermediate lens, $f_2$ represents the focal length of the imaging lens, and $f_1/f_2$ is greater than or approximately equal to 3.

As will be discussed more fully later herein, the Seidel errors of the projection lens system can be reduced by this type of illumination so that the usable number of picture elements is substantially increased. Divergent illumination can be achieved, for example, by positioning the beam deflection system behind the front focal plane of the last condenser lens along the beam path. This can also be achieved by utilizing a beam deflection system which comprises two oppositely-excited deflection systems, the first of which deflects the beam away from the optical axis of the apparatus and the second of which redirects the beam towards the optical axis. In both of the aforementioned embodiments of the invention, the aperture error of the last condenser lens can be dynamically compensated for by additionally exciting the last condenser lens or the first of the deflection systems along the beam path. If freedom from distortion is more important than resolution of the image, the ray bundle can be directed strictly parallel to the optical axis of the apparatus by an additional excitation of this type or any excitation of the deflection system.

In another preferred embodiment of the invention, a second deflection system is disposed between the mask and the specimen through the excitation of which the area of the specimen is selected in which the illuminated surface of the mask is imaged. This additional deflection system enables complicated circuit patterns to be fabricated on the specimen in building block fashion from standard patterns given by partial surface areas of the mask. In the apparatus described in the paper by Heritage, a deflection system is similarly disposed between the mask and the specimen. This deflection system, however, functions only the shift the image of the mask relative to the specimen to effect fine adjustment between the mask and the specimen. This function can also be achieved by the additional deflection system of the inventive apparatus. Such a deflection system can also limit the distortion which is tolerated when the mask is illuminated divergently.

These and other novel features and advantages of the invention will be described in greater detail in the following detailed description.

BRIEF DESCRIPTION OF THE DRAWINGS

In the drawings, wherein similar reference numerals denote similar elements throughout the several views thereof:

FIG. 3 is a schematic illustration of the principle of divergent illumination which is carried out by the improved apparatus shown in FIG. 2; and FIG. 4 is a schematic illustration of still a further embodiment of an improved charged-particle beam optical apparatus constructed according to the present invention.

DETAILED DESCRIPTION

Figure 1:
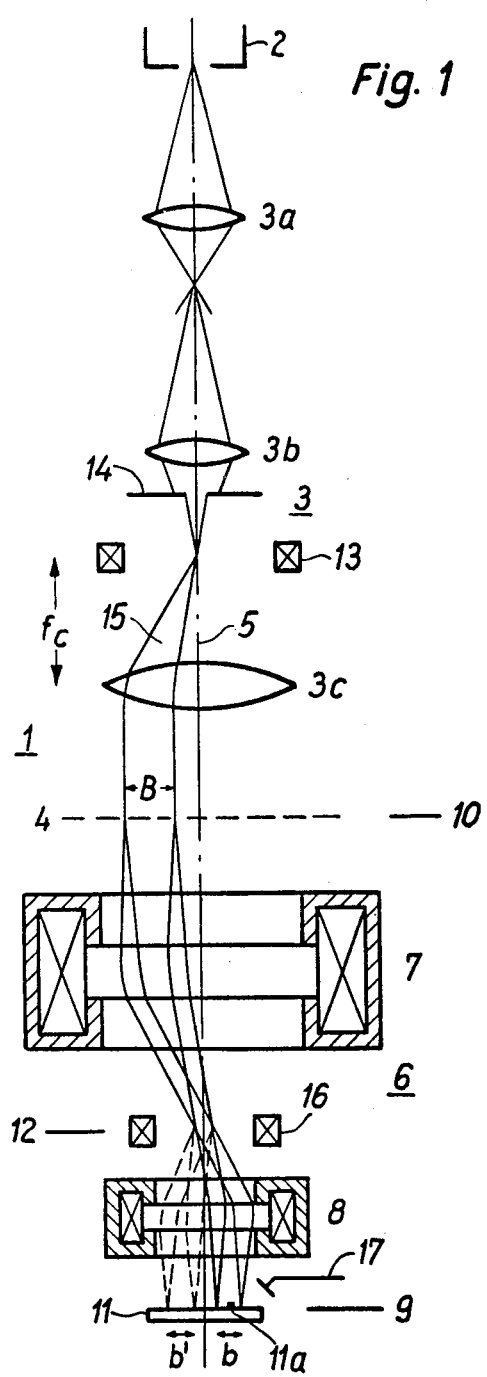
FIG. 1 is a schematic illustration of one embodiment of an improved charged-particle beam optical apparatus constructed according to the present invention.

Referring now to the drawings, and in particular to FIG. 1, there is shown a charged-particle beam optical apparatus including an electron source 2, a three-stage condenser lens system comprising condenser lenses 3a, 3b and 3c, and a projection lens system comprising a long-focal-length intermediate lens 7 and a short-focal imaging lens 8. The ray path of the projection lens system 6 is telecentric and the rear focal plane of the intermediate lens 7 and the front focal plane of the imaging lens 8 coincide in the plane 12. Lenses 7 and 8 comprise magnetic lenses and are preferably excited in an equal and opposite manner, i.e., the lenses have the same number of ampere-turns and the directions of their magnetic fields are opposed. This type of excitation, in conjunction with the telecentric ray path, reduces the magnitude of the rotation color error, the magnification color error, and the isotropic distortion in the projection lens system to zero and at least partially eliminates the remaining errors. A mask 4 is reduction imaged, i.e., imaged on a reduced scale, on a specimen 11, for example, a semiconductor wafer. The mask is located in the front focal plane 10 of the intermediate lens 7. The specimen 11 is disposed in the rear focal plane 9 of the imaging lens 8.

A first deflection system 13 and a diaphragm 14 are disposed ahead of the last condenser lens 3c (which has a focal length $f_c$). The diaphragm 14 screens a bundle of rays 15 out of the electron beam and shapes it using a diaphragm aperture which may be, for example, either circular or square. The deflection system 13 comprises, for example, two orthogonal pairs of electromagnetic coils. It should be noted however, that the deflection system may also comprise two pairs of electrostatic deflection plates. The deflection system is located in the front focal plane of the condenser lens 3c. The source 2 is also imaged by the condenser lenses 3a and 3b in this focal plane. As a result, the bundle of rays 15 forming the probe comprises a plurality of parallel rays after passing through the last condenser lens 3c, which rays are parallel to the optical axis 5 of the apparatus when the bundle is deflected by the deflection system 13.

The ray bundle 15 illuminates mask 4 in an area B which is selected by appropriate excitation of deflection system 13. This area is imaged in the illustrated manner by lenses 7 and 8 on an area b of the specimen 11. If deflection system 13 is excited by a raster generator so that the ray bundle 15 scans mask 4 line by line, the entire surface area of the mask is imaged on specimen 11.

In order to achieve adjustment, i.e., positioning of, the mask 4 and specimen 11 relative to each other, the mask is provided with a test opening which corresponds to an adjustment marking provided on specimen 11. It is assumed that area B of mask 4 shown in FIG. 1 has such a test opening, for example, a slit extending perpendicular to the plane of the drawing. This test opening cooperates with an adjustment marking 11a on specimen 11 which may also take the form of a line extending perpendicular to the plane of the drawing. This adjustment marking may, for example, have a secondary-electron emission capacity with is greater than that of its environment. The secondary electrons emanating from the marking are registered by a detector 17 and, after amplification, are transmitted to a measuring instrument or a display apparatus. The mask and the specimen are then shifted relative to each other until the image of the test opening coincides with the adjustment marking 11a, which is determined by the occurrence of a maximum of secondary electron emission. It should be noted, however, that the current flowing through specimen 11 may also be measured. This current is decreased in magnitude by the secondary electron emission. An additional deflection system 16 is located in the common focal plane 12 of the lenses 7 and 8. This deflection system enables the image b of the mask area B on the specimen to be displaced, for example, by wobbling and thereby facilitates finding the adjustment marking 11a during adjustment.

As can be seen from the foregoing description, the excitation of the condenser lens system 3 is the same during adjustment as during imaging of the mask. Problems due to changes of the condenser excitation when making the transition from adjustment to imaging are, thus, eliminated. The apparatus of the invention also enables complicated circuit patterns to be composed on the specimen by adding together, in typesetting fashion, elementary patterns. Assuming that the area B contains the complete pattern for an elementary circuit to be generated on specimen 11, for example, an amplifier, the pattern, which is imaged on an area b of specimen 11, is positioned by appropriate excitation of deflection system 16 at any desired point on specimen 11, for example, to the position b', along the ray path indicated by the dashed lines in FIG. 1. The coincidence of the image b with its intended position b' is achieved by bringing the image of test openings in the mask into coincidence with adjustment markings provided on the specimen. Patterns for additional elementary circuits which are contained in mask 4 may be selected by corresponding excitation of deflection system 13 and may be imaged by appropriate excitation of deflection system 16 on a likewise selectable partial surface area of the specimen. A ray path of the type illustrated in FIG. 1 in which the ray bundle 15 is always parallel to optical axis 5 of the apparatus regardless of its distance from the axis can be achieved only by using an ideal condenser lens 3c. The effect of the aperture error of the lens 3c is discussed later.

Figure 2:
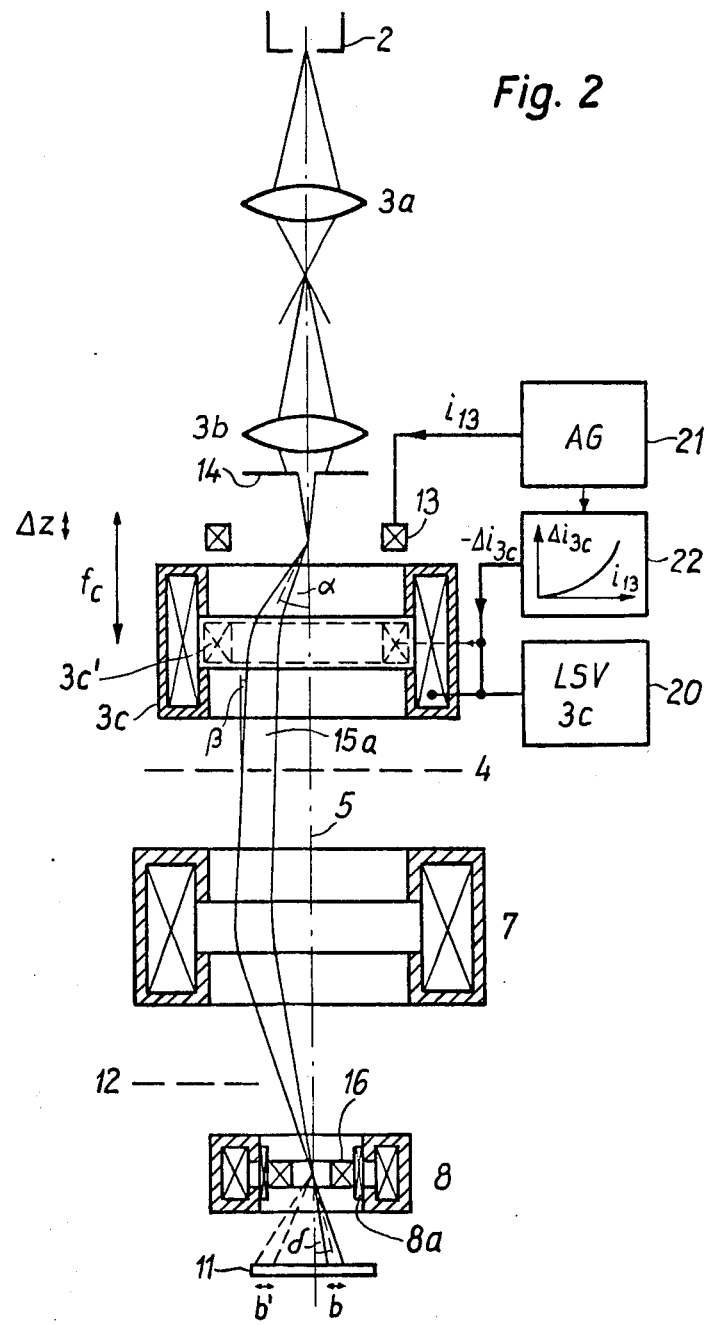
FIG. 2 is a schematic illustration of another embodiment of an improved charged-particle beam optical apparatus constructed according to the present invention.

FIG. 2 illustrates another embodiment of the apparatus of the invention using divergent illumination of the mask. Deflection system 13 is located in this embodiment within the focal length $f_c$ of the last condenser lens 3c. Its distance from the focal plane, i.e., the defocusing, is represented by the reference character $\Delta z$. The ray bundle 15a leaves condenser lens 3a in divergent fashion and strikes the mask 4 at an angle $\beta$ with respect to the optical axis 5. The angle $\beta$ is determined by equation (1) set forth later herein. As a result, all rays of the bundle 15a pass through the center of the imaging lens 8 (as will be explained later in greater detail with reference to FIG. 3). An area B of the mask is imaged in the area b of the specimen 11. Deflection system 16 is located in this embodiment in the center plane of lens 8 so that the image in area b may be shifted on specimen 11 while the rays of bundle 15a pass through the center of lens 8 as previously.

The embodiment of the invention shown in FIG. 2 may be used for imaging the entire mask 4, scanning the mask line by line by means of deflection system 13 while deflection system 16 is inactive. As will be shown, the image has high resolution due to the divergent illumination. A certain amount of distortion is, however, tolerated compared to a ray path with parallel illumination of the mask. In theory, this distortion can be compensated for by exciting deflection system 16 as a function of the deflection of ray bundle 5a. It should be noted, however, that the apparatus shown in FIG. 2 can also be used to fabricate elementary patterns in typesetting fashion if the area B to be imaged is selected by static excitation of deflection system 13 and the desired position b' of the image b is effected by a corresponding static excitation of deflection system 16. The image can be moved to position b', as already explained, by using test openings and adjustment markings. The distortion of the lenses 7 and 8 which is caused by the divergent incidence of the ray bundle 15a is compensated for in this embodiment without difficulty.

The operation of the divergent illumination apparatus shown in FIG. 2 is in theory as follows:

A ray starting from a point of the mask passes with divergent illumination through the center plane of the longfocal-length intermediate lens at a point which is further from the optical axis of the apparatus than with parallel illumination. The Seidel errors caused by the intermediate lens therefore become larger. The same ray passes through the imaging lens at a point closer to the optical axis than with parallel illumination. The errors, thus, become smaller. The increase in the distance from the optical axis in the intermediate lens and the reduction of the distance from the optical axis in the imaging lens have the same magnitude. However, since the change in distance relative to the lens diameter in the case of the imaging lens is greater than in the case of the intermediate lens, an overall decrease in the errors results and, therefore, the usable number of picture elements increases by a factor of about two (2).

In FIG. 3, the ray paths shown in the apparatus of FIGS. 1 and 2 are illustrated for the purpose of comparison. The point P of the mask 4 is located at a distance R from the optical axis 5. Ray 15, which has parallel incidence, also passes through the center plane of intermediate lens 7 at the distance R from the optical axis, intersects axis 5 in the common focus $F_1$, $F_2$ of lenses 7 and 8, and leaves lens 8 parallel to optical axis 5. FIG. 3 shows the focal lengths $f_1$ and $f_2$ of lenses 7 and 8. The ratio $f_1/f_2$ is the reduction with which mask 4 is imaged on specimen 11.

As previously explained, divergent illumination of the mask 4, while causing somewhat greater imaging errors in the intermediate lens 7, causes substantially smaller imaging errors in the imaging lens 8, so that overall, an improvement of the imaging by the projection lens system 6 is produced. The following estimate of the optimum divergence angle $\beta$ is based on the consideration that with a large reduction, the errors caused by the imaging lens 8 by far predominate and the imaging properties of the projection lens system 6 are optimum if the rays pass through imaging lens 8 in the center, i.e., along the optical axis 5. The ray 15a shown in FIG. 3 travels along this path. It also passes through the point P of mask 4 and reaches the center plane of intermediate lens 7 at a distance R + $\Delta$R from the optical axis. Because the optical system is telecentric, rays 15 and 15a are parallel to each other between lenses 7 and 8. The distance by which ray 15 is moved to the left in the center plane of the lens 8 further than ray 15a, is, thus, also equal to $\Delta R$. It can be seen from FIG. 3 that $\beta = \Delta R/f_1$. Since on the other hand, $\Delta R$ is the reduced image of R, $\Delta R = R \cdot f_2/f_1$. Accordingly, the following relationship is obtained:

$$\beta = R \cdot f_2/f_1^2. \quad (1)$$

From FIG. 1 and elementary relations of geometric optics, it can readily be derived that in order to obtain this optimum divergence angle $\beta$, a certain amount of defocussing $\Delta z$, determined by the equation $$\Delta z = f_c^2/(f_1^2/f_2) \quad (2)$$

where $f_c$ represents the focal length of the last condenser lens 3c, is required. From equations (1) and (2) of the following relationship is obtained:

$$\beta = R \cdot \Delta z/f_c^2. \quad (3)$$

These conditions apply for an ideal condenser lens. In actuality, however, the aperture error of condenser lens 3c causes an additional inclination $\beta_{C_o}$, particularly of the rays located away from the optical axis of the apparatus. This inclination is determined by the following equation:

$$\beta_{C_o} = - C_o (R^3/f_c^4), \quad (4)$$

where $C_o$ represents the aperture error constant of condenser lens 3c. The aperture error, thus, decreases the angle $\beta$ determined by equation (1). This error can be corrected by increasing the magnitude of $\Delta z$ over that given by equation (2).

In the following equations, $\Delta z$ represents, as before, that amount of defocusing which is required to satisfy equation (1) without taking the aperture error into consideration, and $\Delta z'$ is the defocusing when the aperture error is compensated for. The inclination angles which are obtained without aperture error for the defocusing increments $\Delta z$ and $\Delta z'$ are represented by $\beta_{\Delta z}$ and $\beta_{\Delta z'}$, respectively. Accordingly:

$$\beta_{\Delta z'} = \beta_{\Delta z} - \beta_{C_o} \quad (5)$$

from which relationship the following is obtained, according to equations (1), (3) and (4):

$$R \cdot \Delta z'/f_c^2 = R \cdot f_2/f_1^2 + C_o \cdot R^3/f_c^4. \quad (6)$$

The optimum defocusing is thus $$\Delta z' = f_2 \cdot f_c^2/f_1^2 + C_o \cdot R^2/f_c^2 \quad (7)$$

It can be seen from equation (7) that an exact compensation of the aperture error is possible in the apparatus shown in FIG. 2 only for one value of R, i.e., only for one ring zone of the image. To achieve optimum correction, $\Delta z'$ is preferably chosen for a value of R which corresponds approximately to the radius of the mask.

Compensation of the aperture error for all the values of R is possible, however, by varying the lens current of condenser lens 3c as a function of the deflection angle $\alpha$. In FIG. 2, the lens current supply for condenser lens 3c is identified by reference numeral 20. This supply generates a current $i_{3c}$ which is supplied to the winding of the lens. The current is constant and is apportioned so that for small deflection angles, $\alpha$, a defocusing increment $\Delta z$ is obtained according to equation (2). Deflection system 13 is excited by deflection generator 21 in response to the current $i_{3c}$. Deflection generator 21 also drives an amplifier 22 which supplies an additional current $\Delta i_{3c}$, depending upon the deflection angle $\alpha$, to the winding of lens 3c. The additional current is negative, so that the excitation of lens 3c decreases if the deflection angle $\alpha$ increases, and the amount of the defocusing increment $\Delta z$ increases thereby. Since $\Delta z'$ depends, according to equation (7), on $R^2$, amplifier 22 is preferably designed so that, as shown in FIG. 2, the additional current $\Delta i_{3c}$ depends approximately on the square of the current $i_{13}$.

The excitation of deflection system 13 is shown in a simplified manner in FIG. 2 and only for one pair of deflection coils. If ray bundle 15a is deflected simultaneously in the x and y-axis directions by the two deflection coil pairs, then the root of the sum of the squares of $i_x$ and $i_y$ replaces $i_3$ as the driving current for amplifier 22. If condenser lens 3c has an iron shell, as shown in FIG. 2, it can be difficult to exactly set its excitation in accordance with the variable component, additional current $\Delta i_{3c}$. In this case, it is preferable to provide an iron-free auxiliary lens 3c' inside lens 3c, as indicated by the dashed lines in FIG. 2, through which the additional current $\Delta i_{3c}$ flows.

In certain situations, it may be desirable to dispense with high image resolution and to strive for freedom from distortion instead. In order to achieve this, the embodiment of the apparatus shown in FIG. 2 may be modified so that ray bundle 15a is always parallel to optical axis 5, regardless the magnitude of the deflection angle $\alpha$. To achieve this, deflection system 13 is disposed in the front focal plane of condenser 3c 3c so that the defocusing increment $\Delta z$ is also zero when the deflection angle $\alpha$ is equal to zero. The additional excitation current $\Delta i_{3c}$ is supplied to the condenser lens which, as already described, depends approximately on the square of the current $i_{13}$. This corresponds to the elimination of the first component of $\Delta z'$ according to equation (7) so that only an $\alpha$-dependent defocusing remains for correcting the aperture error of lens 3c.

The projection lens system (lenses 7 and 8), and particularly the imaging lens 8, causes a curvature of the image field which can also be compensated for dynamically by a supplemental excitation. This supplemental excitation must have an effect such that for large values of the angle between the ray bundle which strikes specimen 11 and the optical axis of the apparatus, the excitation of lens 8 is decreased and the focal length is thereby increased. To achieve this, an iron-free supplemental lens 8a may be used in a manner similar to condenser lens 3c, which is excited in a manner opposite to the main winding of lens 8 as a function of the deflection angle $\alpha$ and the deflection angle $\delta$ caused by deflection system 16. A stigmator (not shown) associated with imaging lens 8 may be excited in a similar manner as a function of $\alpha$ and $\delta$ so that the astigmatism caused by these angles is optimally corrected.

In the embodiment of the invention illustrated in FIG. 2, the divergent incidence of the bundle forming the probe is due to the fact that the first deflection system is defocused relative to the last condenser lens. It should be noted, however, that the first deflection system may also comprise two-oppositely-excited deflection systems to achieve divergence. The illuminating portion of such an apparatus is shown in FIG. 4. In this embodiment, the first deflection system comprises two deflection systems 13a and 13b. Deflection system 13a is disposed in the front focal plane of the last condenser lens 3c. The beam source 2 is likewise imaged in this plane by lenses 3a and 3b. The ray bundle 17, therefore, leaves the lens 3c as a bundle of parallel rays and forms a two-dimensional probe on the mask 4. The shape and size of this probe are determined by a diaphragm 14 and the imaging portion is the same as that shown in FIG. 2. Bundle 17 converges in a point of the focal plane of lens 7 and its central ray passes through the center of lens 8.

Deflection system 13b is located in the front focal plane of the condenser lens 3b and is excited in a manner opposite deflection system 13a. Deflection system 13b deflects the ray bundle 17 through the angle $\gamma$ away from the optical axis. After passing through lens 3b, the ray bundle 17 is, therefore, laterally ofset relative to optical axis 5 and travels parallel to it. The distance of the central ray from the optical axis is designated by the reference character r in FIG. 4. It can be seen from this figure that due to the offset distance r, deflection of the ray bundle through the angle $\alpha$ causes the bundle to leave lens 3c at the angle $\beta$ since the point about which the bundle is tilted does not lie on the optical axis.

The deflection systems 13a and 13b are coupled to a common deflection generator AG which supplies deflection system 13a with the current $i_{13a}$ and deflection system 13b with the current $i_{13b} = -P \cdot i_{13a}$, where the P is first considered as constant. The factor P is calculated as follows, assuming that mask 4 lies in the focal plane of lens 3c and deflection systems 13a and 13b are identically designed, i.e., the systems deflect through the same angles for the same excitation. Thus, from FIG. 4, the angles $\alpha$, $\beta$ and $\gamma$ are obtained as follows:

$$\alpha = R/f_c \quad (8)$$

$$\beta = r/f_c \quad (9)$$

$$\gamma = r/f_b \quad (10)$$

Then from equations (9) and (10) the following is obtained:

$$\beta = \gamma \cdot (f_b/f_c) \quad (11)$$

And, from equations (1) and (8):

$$\beta = \alpha \cdot f_c \cdot f_2/f_1^2. \quad (12)$$

Therefore, $$\gamma \cdot (f_b/f_c) = \alpha \cdot f_c \cdot f_2/f_1^2 \quad (13)$$

and thus $$P = \gamma/\alpha = (f_c^2 \cdot f_2)/(f_b \cdot f_1^2). \quad (14)$$

The foregoing calculations apply only for an ideal condenser lens. If the aperture error of lens 3c is to be taken into consideration, an additional current is superimposed on the current $-P \cdot i_{13a}$, for exciting deflection system 13b which flows in the same direction and increases more than proportionally with the current $i_{13a}$ and preferably depends on the value $i_{13a}^2$. If, in order to eliminate distortion, the apparatus of FIG. 4 is modified so that ray bundle 17 always arrives at the mask 4 in parallel fashion, regardless the distance R, the deflection system 13b should be excited exclusively by the described additional current.

It should be noted that the invention is not limited to apparatus using magnetic lenses and that electrostatic lenses may also be used. The invention is also independent of the type of charged particles used for imaging and may be used in electron as well as ion-optical apparatus.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a charged-particle beam optical apparatus for the reduction imaging of a mask on a specimen to be examined, said apparatus comprising a beam source for illuminating the mask, a condenser lens system comprising a plurality of condenser lenses for generating a ray bundle which strikes the mask as a probe, a beam deflection system located ahead of the last of the condenser lenses in the direction of the beam path, and a projection lens system including a long focal length intermediate lens and a short focal length imaging lens, said intermediate and imaging lenses being spaced apart by a distance which is equal to the sum of their focal lengths, said mask being located in the front focal plane of said intermediate lens, the improvement comprising means for generating a probe in the form of a ray bundle comprising a plurality of rays which are at least approximately parallel to each other and which simultaneously illuminate a partial two-dimensional surface area of said mask, at least a partial surface area of said mask a test opening and being imaged, when illuminated, on an area of said specimen having an adjustment marking for adjusting the position of said mask with respect to said specimen.

2. The apparatus recited in claim 1, wherein said generating means comprises means for generating a probe so that said mask is illuminated divergently and a ray of said ray bundle strikes said mask at a distance R from the optical axis of the apparatus at an angle $\beta$ with respect to said optical axis, said angle being measured in radians and being defined by the equation $$\beta = R \cdot f_2/f_1^2$$

where $f_1$ represents the focal length of said intermediate lens, $f_2$ represents the focal length of said imaging lens, and $f_1/f_2$ is greater than or approximately equal to 3.

3. The apparatus recited in claim 1, wherein said generating means comprises means for generating said probe and for compensating for aperture errors of said last condenser lens so that said ray bundle strikes said mask in a direction parallel to the optical axis of the apparatus for any excitation of said deflection system.

4. The apparatus recited in claim 2, wherein said deflection system is disposed behind the front focal plane of said last condenser lens in the direction of the beam path.

5. The apparatus recited in claim 2, further comprising means for exciting said last condenser lens as a function of the excitation of said deflection system.

6. The apparatus recited in claim 3, further comprising means for exciting said last condenser lens as a function of the excitation of said deflection system.

7. The apparatus recited in claim 2, wherein said deflection system comprises two oppositely-excited deflection systems.

8. The apparatus recited in claim 3, wherein said deflection system comprises two oppositely-excited deflection systems.

9. The apparatus recited in claim 7, further comprising means for exciting the first one of said two deflection systems in the direction of said beam so that said excitation depends more than proportionally on the excitation of the second of said deflection systems in the direction of the beam.

10. The apparatus recited in claim 8, further comprising means for exciting the first one of said two deflection systems in the direction of said beam so that said excitation depends more than proportionally on the excitation of the second of said deflection systems in the direction of the beam.

11. The apparatus recited in claim 1, further comprising a second deflection system disposed between said mask and said specimen through the excitation of which an area of the specimen is selected on which said illuminated surface area of said mask is imaged.

12. The apparatus recited in claim 11, wherein said second deflection system is disposed in the center plane of said imaging lens.

13. The apparatus recited in claim 11, wherein said second deflection system is disposed behind the center plane of said imaging lens in the direction of the beam path.

* * * * *